United States Patent [19]
Ogura et al.

[11] Patent Number: 4,643,950
[45] Date of Patent: Feb. 17, 1987

[54] SEMICONDUCTOR DEVICE

[75] Inventors: Atsushi Ogura; Koji Egami, both of Tokyo, Japan

[73] Assignee: Agency of Industrial Science and Technology, Tokyo, Japan

[21] Appl. No.: 837,005

[22] Filed: Mar. 6, 1986

[30] Foreign Application Priority Data

May 9, 1985 [JP] Japan .................................. 60-96744

[51] Int. Cl.$^4$ ............................................. B32B 9/04
[52] U.S. Cl. .................................. 428/446; 428/448; 428/698; 428/699
[58] Field of Search ................ 428/446, 448, 698, 699

[56] References Cited

U.S. PATENT DOCUMENTS

| | | | |
|---|---|---|---|
| 4,187,344 | 2/1980 | Fredriksson | 428/446 |
| 4,489,128 | 12/1984 | Rutz | 428/446 |
| 4,540,673 | 9/1985 | Takeda et al. | 428/698 |
| 4,542,073 | 9/1985 | Tanaka et al. | 428/446 |
| 4,590,130 | 5/1986 | Cline | 428/448 |

OTHER PUBLICATIONS

2nd Workshop on Future Electron Device—SOI Technology and 3D Integration—[FED SOI/3D Workshop], Mar. 19-21, 1985, pp. 19-23, "Laser Recrystallization on Multi-Layered Structure".
"Three Dimensional CMOS IC's Fabricated by Using Beam Recrystallization" IEEE, Electron Device Letters, vol. EDL-4, No. 10, Oct. 1983.
"Amorphous Si/Crystalline—Si Facet Formation During Si Solid Phase Epitaxy near Si.SiO$_2$ Boundary", J. Applied Physics, 56 (12), Jul. 15, 1984, pp. 279-285.
"Disclocations and Twins Formed in Zone Melted Recrystallized Si on SiO$_2$", J. Applied Physics, 56 (8), Oct. 15, 1984, pp. 2213-2217.
"Measurement of Local Stress in Laser-Recrystallized Lateral Epitaxial Silicon Films over Silicon Dioxide Using Raman Scattering", Appl. Phys. Lett. 43 (2), Jul. 15, 1983.
"Determination of Existing Stress in Silicon Films on Sapphire Substrate Using Raman Spectroscopy", Solid—State Electronics, vol. 23, pp. 31-33.
"Multilayer CMOS Device Fabricated on Laser Recrystallized Silicon Islands", IEDM 83.

Primary Examiner—William J. Van Balen
Attorney, Agent, or Firm—Blakely, Sokoloff, Taylor & Zafman

[57] ABSTRACT

In a laminated semiconductor device comprising a substrate, an insulating layer formed on the substrate and at least one active layer formed on the insulating layer, the insulating layer contains an AlN layer as an interlayer insulating film.

5 Claims, 5 Drawing Figures

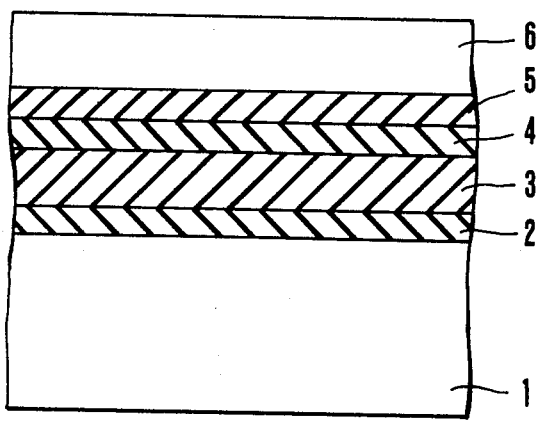
F I G. 2

SEMICONDUCTOR DEVICE

BACKGROUND OF THE INVENTION

This invention relates to a semiconductor device of a laminated construction.

In most cases, the silicon oxide has been used as the interlaid insulating film of the three dimensional integrated circuits as disclosed in Extended Abstract of 2nd Workshop on Future Electron Device—SOI Technology and 3D Integration—[FED SOI/3D Workshop], March 19-21, 1985, pp. 19-23 "Laser Recrytallization on Multi-Layered Structure". An example of using silicon nitride and phosphosilicate glass (PSG) as an insulating layer is described in a paper entitled "Three Dimentional CMOS IC's Fabricated by Using Beam recrystallization" IEEE, Electron Device Letters, Vol. EDL-4, No. 10, Oct. 1983. A SOI (Silicon On Insulator) technique utilizing the solid phase epitaxy of amorphous Si is disclosed in a paper entitled "Amorphous Si/crystalline—Si facet formation during Si solid phase epitaxy near Si/SiO$_2$ boundary", J. Applied Physics, 56 (12), 15 July 1984, pp 279-285. The SOI by zone melting technique is described in a paper entitled "Dislocations and twins formed in zone melted recrystallized Si on SiO$_2$, "J. Applied Physics, 56 (8), 15 Oct. 1984, pp. 2213-2217.

One example of the semiconductor element having the laminated construction in the prior art is illustrated in FIG. 1. As shown, a SiO$_2$ layer 8 having a thickness of 1~1.5 microns is formed on a silicon substrate 7 by the sputtering technique and then a silicon active layer 9 is deposited on the SiO$_2$ layer 8.

The SiO$_2$ layer 8 utilized in the element having the conventional laminated construction has a linear thermal expansion coefficient of $0.35 \times 10^{-6} \text{deg}^{-1}$. Although definite values of the linear thermal expansion coefficients of the PSG, BSG and PBSG are not yet confirmed, it is estimated that these values are considerably smaller than the linear thermal expansion coefficient $2.5 \times 10^{-6} \text{deg}^{-1}$ the silicon forming the active layer 9.

According to the presently used SOI technique, an amorphous silicon or a polycrystalline silicon deposited on an insulator is heated to grow crystal particles from solid phase or liquid phase, or a silicon is directly deposited on a heated insulator. When any one of these methods is used to form the element of a laminated construction, there is a large difference between the temperature for forming the laminated construction (especially the temperature for forming the silicon active layer), and the operating temperature (usually room temperature) of the element.

This temperature difference and the fact that the thermal expansion of the interlayer insulating film is smaller than that of the silicon active layer cause a residual stress not only in the silicon active layer but also in the interlayer insulating film at the operating temperature of the element. In an extreme case, microcracks are formed.

SUMMARY OF THE INVENTION

Accordingly, it is an object of this invention to provide an improved semiconductor device having the small residual stress and no microcrack.

According to this invention there is provided a laminated semiconductor device of the type wherein an insulating layer is formed on a substrate and at least one active layer is formed on the insulating layer, characterized in that the insulating layer contains an AlN layer as an interlaid insulating film.

DESCRIPTION OF THE DRAWINGS

In the accompanying drawings:

FIG. 2 is a sectional view showing one embodiment of the semiconductor device according to this invention;

DESCRIPTION OF THE PREFERRED EMBODIMENTS

Figure 1:
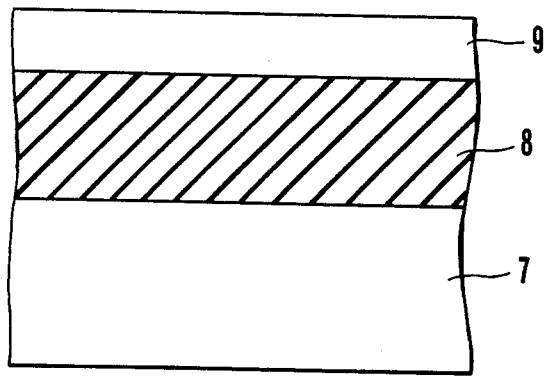
FIG. 1 is a sectional view showing a prior art semiconductor device.

We have formed silicon films on substrates of various materials and after recrystallization by subjecting the silicon films to laser annealing, the residual stress in the silicon films was measured by using Raman spectroscopy (a paper entitled "Measurement of local stress in laser crystallized lateral epitaxial silicon films over silicon dioxide using Raman scattering", Applied Physics Letter 43 (2), July, 1983, pp. 177-179. The Raman peak of a bulk silicon film which has no stress appears at a portion of 520.5 cm$^{-1}$. It is well known that the shift $\Delta\omega$ of the Raman peak from that of the bulk silicon film caused by the residual stress has a proportional relation of $\Delta S = 2.49 \times 10^9 \Delta\omega$ (dyne/cm$^2$) with respect to the stress value $\Delta S$, as disclosed in a paper entitled "Determination of Existing Stress in Silicon films on Sapphire Substrate using Raman Spectroscopy", Solid State Electronics Vol. 23, pp 31-33. Where a corning 7740 glass substrate or a silicon substrate formed with a SiO$_2$ film on the surface thereof, which have nearly equal thermal expansion coefficients to that of the silicon, is used, the residual stress is considerably large ($\Delta\omega \sim -3 \text{cm}^{-1}$). Further, a quartz substrate having the thermal expansion coefficient one order of magnitude smaller than that of silicon has much larger residual stress ($\Delta\omega \sim -6 \text{cm}^{-1}$). When an alumina substrate having thermal expansion coefficient ($7 \times 10^{-6}$ deg.$^{-1}$) larger than that of silicon is used, the residual stress is small ($\Delta\omega \sim +1.4 \text{cm}^{-1}$).

Thus, it was noted that the stress of the silicon film formed on a substrate having a larger absolute value of the thermal expansion coefficient than silicon is smaller than the stress of the silicon film formed on another substrate having a smaller absolute value of the thermal expansion coefficient than silicon, eventhough the differences between the thermal expansion coefficients of these two substrates and the silicon film are same.

Since such interlaid insulating film as SiO$_2$ film is formed on a substrate, it is essential that a mean value of thermal expansion coefficients of the substrate and the interlaid insulating film should be more or less larger than the thermal expansion coefficient of silicon. According to this invention, there is provided a laminated semiconductor device having a small residual stress and having no microcrack by using an AlN layer having a larger thermal expansion coefficent ($4.0 \times 10^{-6}$ deg.$^{-1}$) than silicon as an interlaid insulating film.

FIG. 2 is a sectional view useful to explain an embodiment of this invention. A silicon nitride ($Si_3N_4$) layer 2 having a thickness of 500-1000 Angstrom and acting as a barrier layer for preventing diffusion of Al atoms in an AlN layer 3 into a silicon substrate 1 is deposited with conventional sputtering method using argon gas, and then an AlN layer 3 having a thickness of 3 microns was formed on the silicon nitride layer 2 with reactive sputtering method while maintaining the substrate 1 at room temperature. Furthermore, a silicon nitride layer 4 having the thickness of 500-1000 Angstrom was deposited by the same method as the layer 2, the layer 4 acting as a barrier layer for preventing diffusion of Al atoms in the AlN layer 3 into an upper layer. Furthermore, a $SiO_2$ layer 5 having a thickness of 1000 Angstrom was deposited on the silicon nitride layer 4 by sputtering in the same manner as layers 2 and 4 for the purpose of matching the interfacial energy of the layer 4 and the upper layer. The layers 2 5 totally act as an insulating layer instead of a prior art $SiO_2$ film or PSG, BSG and PBSG films. Finally, a polycrystalline silicon (Poly-Si) film 6 having a thickness of 1 micron was deposited on the $SiO_2$ layer 5 by low pressure chemical vapor deposition technique at a temperature of 700° C. utilizing monosilane ($SiH_4$) as the raw material gas. In the deposited state, the texture <100> of this Poly-Si film 6 is oriented in the vertical direction to the substrate 1. The Poly-Si film 6 was annealed by CW-Ar laser beam under conditions of a laser beam diameter of 50 microns, laser power of 8 Watts, a scanning speed of 10 mm/sec. and a substrate heating temperature of 300°~400° C. to form a silicon active layer 6.

Figure 3:
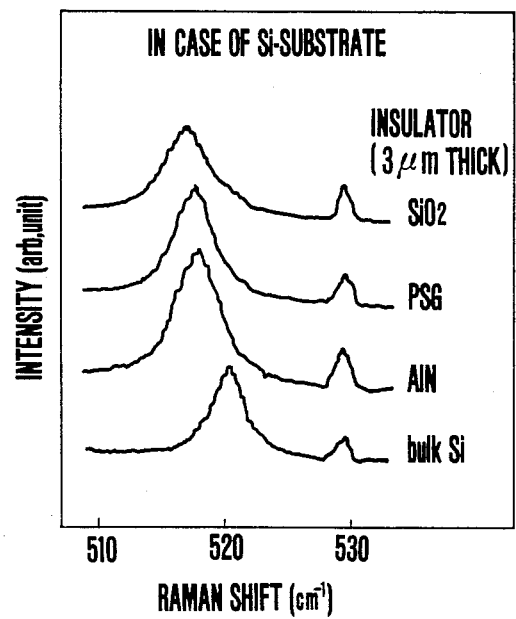
FIG. 3 is a graph showing the Raman spectrum of an embodiment of this invention.

The silicon active layer 6 thus obtained and the silicon active layer 9 shown in FIG. 1 prepared for comparison were investigated in detail with the preferencial (chemical) etching and the Raman spectroscopy and found that the silicon active layer 9 formed on the $SiO_2$ film 8 had microcracks but the silicon active layer 6 formed on the insulating layer including AlN layer did not contain any crack. The result of the Raman spectroscopic measurement showed that the layer 9 had a residual stress (tension type) of $8.0 \times 10^9$ (dyne/$cm^2$), whereas the layer 6 had a residual stress of $5.2 \times 10^9$ (dyne/$cm^2$). This means a decrease of the residual stress in the active layer by about 28% where the multilayer containing AlN layer is used as the insulating layer. FIG. 3 shows the results of the measurement with the Raman spectroscopy. The graphs shown in FIG. 3 shows that the amount of shift of the Raman peak from the Raman peak of bulk Si which is free from stress (the lowermost spectrum) is proportional to the magnitude of the stress in the film. (in terms of the magnitude of stress, it is expressed by $2.49 \times 10^9$ (dyne/$cm^2$/$cm^{-1}$). In FIG. 3, a small peak appearing at about 530 $cm^{-1}$ represents a light emitted from an argon laser used as the exciting light source for the spectroscopic measurement, and has no relation with the result of measurement.

Figure 4:
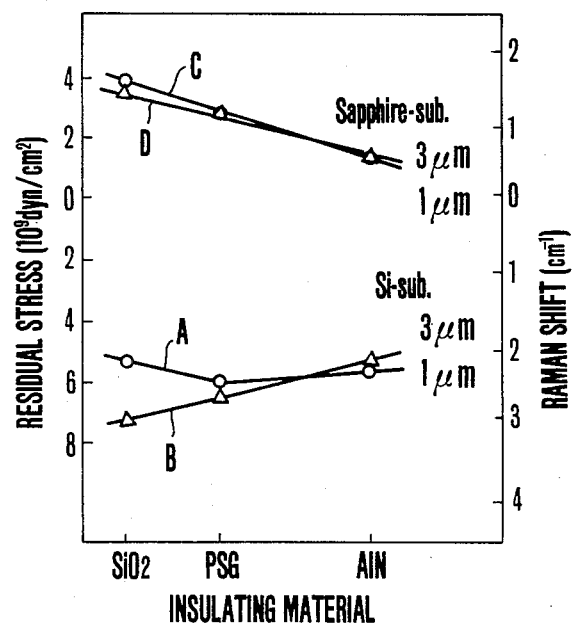
FIG. 4 is a graph showing the difference in the Raman shift caused by the material of the insulating layer utilized in the semiconductor device embodying the invention.

Curves A and B shown in FIG. 4 shows the results of measurement of the variation in the Raman shift caused by materials. In this case, the thicknesses of the interlaid insulator were 1 micron and 3 microns respectively. As can be noted from FIG. 4, the peaks of the Raman shifts were substantially the same in cases where the thickness of the AlN layer 3 was 1 micron and where the thickness of the $SiO_2$ layer 8 was 1 micron.

Figure 5:
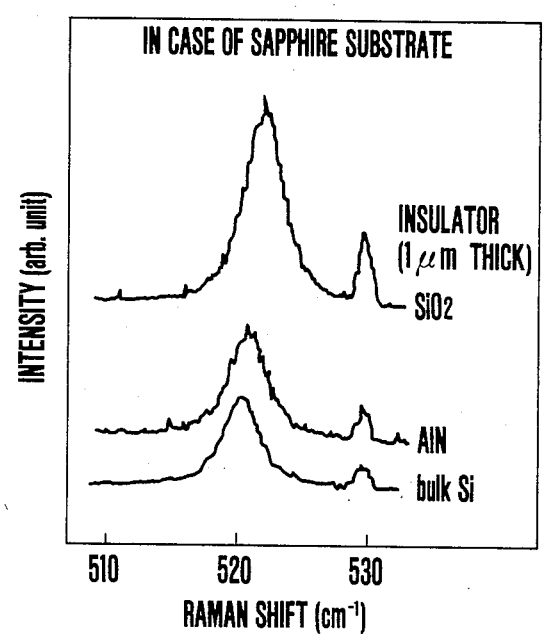
FIG. 5 is a graph showing the Raman spectrum of another embodiment of this invention.

Another embodiment of this invention is as follows. In this embodiment, silicon substrate utilized in the first embodiment was replaced by a sapphire substrate. The thickness of the insulating layer (2~5 in FIG. 2) was made to be 1 or 3 microns, and a silicon active layer 6 was formed by a method similar to that of the first embodiment. FIG. 5 shows the results of the Raman spectroscopic measurement. As shown in FIG. 5, when a sapphire substrate is used instead of a silicon substrate, the residual stress (compression type) was also reduced by 57~62%. Curves C and D shown in FIG. 4 designate the residual stress and variation in the Raman shift where the sapphire substrate is used, taking the substrate material and the thickness of the insulating film as parameters.

The summary examination of the FIG. 4 shows that, when the silicon substrate was used and the thickness of the inlulating film was made to be 1 micron, the reduction in the residual stress caused by the use of a layer containing AlN was not noted. However, when the thickness of the insulating film was increased to 3 microns, any appreciable change in the magnitude of the residual stress was noted, eventhough the AlN layer was used, whereas the residual stress increased remarkably when the $SiO_2$ film was used. This means that the advantageous effect resulting from the use of a layer containing AlN is enhanced with the increase in the thickness of the insulating layer. Further, when a sapphire substrate is used, the advantageous effect of using AlN appears even with an insulating layer having a thickness of 1 micron.

Although in the foregoing embodiments, only one silicon active layer 6 was formed on the substrate, it is also possible to sequentially form a plurality of silicon active layers with interlaid AlN containing layer. In this case the advantageous effect of AlN containing layer is enhanced with the increase in the number of the silicon active layers. It is also possible to prepare a silicon substrate on which a device has been fabricaed, and then form silicon active layers on the device through an AlN containing layer as in the foregoing embodiments.

In the foregoing embodiments, a silicon substrate and a sapphire substrate were used as the substrate 1, other substrates, for example, a ceramic substrate and a glass substrate can also be used. Further, instead of a laser beam, an electron beam, a lamp, a split heater and the solid phase epitaxy can also be used.

With the construction of this invention, a laminated semiconductor device having smaller residual stress than the prior art semiconductor device and free from any microcrack can be provided. Moreover, it is possible to increase the thickness of the interlayer insulating film according to the present invention in comparison with the prior art in which it was necessary to limit the thickness to be less than about 1 micron. This improves the surface flatness after the integration. In other words, the layer can be made thick first and then reduce the thickness to obtain a flat surface.

Furthermore, since the thermal capacity of AlN is larger than that of $SiO_2$, the effect of a heat sink which was realized by inserting a polycrystalline silicon layer, as described in International Electron Device Meeting, 1983, pages 352-355, can be provided without inserting a polycrystalline silicon layer.

What is claimed is:
1. A semiconductor device comprising:
   a substrate, an insulating layer formed on said substrate, said insulating layer containing an AlN layer as an interlaid insulating film, and at lease one active layer formed on said insulating layer.

2. The semiconductor device according to claim 1 wherein said substrate is made of a material selected from the group consisting of silicon, sapphire, ceramic and glass.

3. The semiconductor device according to claim 1 said insulating layer further contains a barrier layer for preventing diffusion of aluminium atoms in said AlN layer into adjacent layer.

4. The semiconductor device according to claim 3 wherein said barrier layer is made of silicon nitride ($Si_3N_4$).

5. A semiconductor device according to claim 3 wherein said insulating layer comprises one barrie layer formed on said substrate, the AlN layer, the other barrier layer, and a silicon oxide layer which are laminated in the order mentioned.

* * * * *